United States Patent [19]

Mecone et al.

[11] 4,281,363
[45] Jul. 28, 1981

[54] MULTILAMP PHOTOFLASH UNIT WITH REFLECTIVE-PROTECTIVE CIRCUIT BOARD ELEMENT

[75] Inventors: David W. Mecone; Donald W. Hartman; Donald E. Armstrong, all of Williamsport, Pa.

[73] Assignee: GTE Products Corporation, Stamford, Conn.

[21] Appl. No.: 98,458

[22] Filed: Nov. 29, 1979

[51] Int. Cl.³ ............................................. G03B 15/02
[52] U.S. Cl. ........................................ 362/6; 362/13; 362/240; 362/294
[58] Field of Search ...................... 362/6, 13, 240, 294

[56] References Cited

U.S. PATENT DOCUMENTS 4,152,751   5/1979   Sindlinger .............................. 362/13

Primary Examiner—Stephen J. Lechert, Jr.
Attorney, Agent, or Firm—Edward J. Coleman

[57] ABSTRACT

A photoflash unit comprising a linear array of photoflash lamps mounted on a printed circuit board disposed within the longitudinal channel of an elongated housing member having an enclosing cover panel of light-transmitting material. The housing channel has a semi-rectangular cross-section and reflective surfaces on the sidewalls adjacent the flashlamps. A flat sheet of material, such as white paper adhesively coated on one side, is secured to the circuit board and interposed between the lamps and the circuitry for reflecting heat and light away from the circuit board and insulating at least portions of the circuitry from the radiant output of the lamps.

8 Claims, 4 Drawing Figures

MULTILAMP PHOTOFLASH UNIT WITH REFLECTIVE-PROTECTIVE CIRCUIT BOARD ELEMENT

BACKGROUND OF THE INVENTION

This invention relates to multilamp photoflash units and more particularly, to a photoflash unit having an array of lamps connected to a printed circuit board and positioned over the surface thereof.

U.S. Pat. Nos. 3,894,226 and 4,017,728 describe a photoflash unit, referred to as a flipflash, which comprises an elongated planar array of eight high voltage type flashlamps mounted on a printed circuit board with an array of respectively associated reflectors disposed therebetween. The flipflash circuit board comprises an insulating sheet of plastic having a pattern of conductive circuit runs, including the terminal contacts, on one surface. The flashlamp lead-in wires are electrically connected to the circuit runs by means of eyelets secured to the circuit board and crimped to the lead-in wires. The circuitry on the board includes a plurality of printed, normaly open, connect switches that chemically change from high to low resistance so as to become electrically conducting after exposure to the radiant energy from an ignited flashlamp operatively associated therewith. The purpose of the switches is to provide lamp sequencing and one-at-a-time flashing. The overall construction of the flipflash unit comprises front and back plastic housing members with interlocking means for providing a unitary structure. Sandwiched between the front and back housing members, in the order named, are the flashlamps, a unitary reflector member, preferably of aluminum-coated plastic, shaped to provide the eight individual reflector cavities of the array, an insulating sheet, a printed circuit board, and an indicia sheet, which is provided with information, trademarks and flash indicators. Each of the individual reflectors has a concave (generally parabolic) surface with the lamps being disposed within this concavity; the rear surface of the reflector has holes or slots to permit light and heat radiation to pass through for actuating the circuit board switches and flash indicators. In this manner, the heat to which the circuit board switches are exposed is controlled by the reflector openings. Further thermal protection for the circuitry is provided by a clear plastic insulator sheet which is interposed between the reflectors and the circuit board and functions both as a heat insulator and means for reducing the amount of heat which activates the heat-sensitive switches on the circuit board. With the maximum amount of reflector surface available behind the lamp, the optimum output efficiency is achieved.

In more current design concepts, the trend is toward providing a photoflash unit construction which is more compact, simplified and cost-efficient. More specifically, it is desired to eliminate the separate multicavity type reflector element. U.S. Pat. No. 3,608,451 to Kelem discloses a flash array having a reflector in the form of a metal coating on a circuit board, the circuit board being larger than the reflector coating so as to provide areas for circuit runs. The reflector coating of the Kelem flash array also functions as the common circuit conductor connected to one lead-in wire of each of the lamps. There is no switching circuitry on the Kelem circuit board.

U.S. Pat. No. 4,136,379 to Chevali discloses a flipflash array having a circuit board made of electrically insulating material having a light-reflecting surface; for example, the circuit board material may comprise polystyrene containing titanium dioxide interspersed therein. In view of the flatness of the reflector surface of the Chevali array, the front of the housing is provided with prisms to improve the distribution pattern of light when the lamps are flashed. U.S. Pat. No. 4,136,378 of Chevali discloses a flipflash array having a circuit board made of transparent electrically insulating material having a light-reflective coating on its rear surface for reflecting light when the lamps are flashed. Again, the front of the housing is provided with prisms to improve the distribution pattern of the light when the lamps are flashed. U.S. Pat. No. 4,148,093 to vanWerkhoven discloses a flash array having a circuit board in which at least a portion of the surface thereof is provided with a reflecting layer at the lamp side; light focusing elements may also be situated near the lamp.

A copending patent application Ser. No. 072,251, filed Sept. 4, 1979, and assigned to the present assignee, describes a more compact, cost-efficient photoflash unit construction comprising a linear array of electrically ignitable flashlamps mounted on a printed circuit board in the form of an elongated strip. The printed circuit board is located within the longitudinal channel of an elongated housing member having a continuous coating of conductive reflective material thereon adjacent to the lamps. A light-transmitting cover panel is attached to the front of the housing member to enclose the flashlamps. The lamps have substantially tubular envelopes and are positioned extremely close to one another with their longitudinal axes substantially parallel to the surface of the printed circuit strip and in substantially coaxial alignment. The lamps lie directly on the top surface of the circuit board onto which are screen-printed appropriate circuit runs and heat-sensitive switches. When the first lamp of the array is flashed, the heat from the lamp should close an associated heat-sensitive switch so that the seond lamp is now introduced into the circuit. However, the heat from the flashed lamp is completely exposed to the circuit and switch conductor runs. This can result in burning out the switch and destroying parts of the circuit runs, thus rendering the array inoperable. None of the aforementioned patents relating to other types of flash arrays which have eliminated the multicavity reflector member pose any solution to this problem of possible thermal damage to circuit elements.

SUMMARY OF THE INVENTION

Accordingly, it is an object of the present invention to provide an improved multilamp photoflash unit of compact, simplified construction which cost-effectively includes means for thermally protecting the circuitry on the circuit board surface from the radiant output of flashed lamps mounted over that surface.

A further object of the invention is to provide increased reflector enhanced light output together with thermal protection of underlying circuitry in a circuit board-mounted flashlamp array having no multicavity reflector member covering the circuit board.

These and other objects, advantages, and features are obtained in a multilamp photoflash unit comprising a printed circuit board having lamp-firing circuitry on a surface thereof to which the lead-in wires of an array of flashlamps are connected. The lamps are positioned over the surface of the circuit board which contains the lamp-firing circuitry. In accordance with the invention, a flat sheet of material is secured to the circuit board and interposed between the lamps and the circuitry for reflecting heat and light away from the circuit board and insulating at least portions of the circuitry from the radiant output of the lamps during flashing.

In a preferred embodiment, the flat sheet of reflective-insulating material comprises white paper which is adhesively coated on one side and secured thereby to the surface of the circuit board. The circuit board is in the form of an elongated strip, and the flashlamps are disposed in the linear array over the surface. The unit further includes an elongated housing member having an elongated channel within which the printed circuit board is located. The channel has a cross-section which is substantially semi-rectangular, and the circuit board is disposed parallel to the rear wall of this channel. The opposite sidewalls of the channel have reflective surfaces adjacent to the flashlamps, and a light-transmitting cover panel is attached to the housing member and encloses the flashlamps therein. The circuitry on the circuit board includes a plurality of radiant-energyactivated switches disposed on the circuit board in alignment with respective lamps. Each of the switches comprises a mass of high resistance material convertible to a conductive state upon being activated by radiant energy. The flat sheet of white material has a plurality of apertures respectively aligned with the central portions of each of these switches. In addition, the flat sheet of whitereflective insulating material has openings at locations where the lead-in wires are connected to the circuitry.

BRIEF DESCRIPTION OF THE DRAWINGS

This invention will be more fully described hereinafter in conjunction with the accompanying drawings, in which.

DESCRIPTION OF PREFERRED EMBODIMENT

Figures 1, 2:
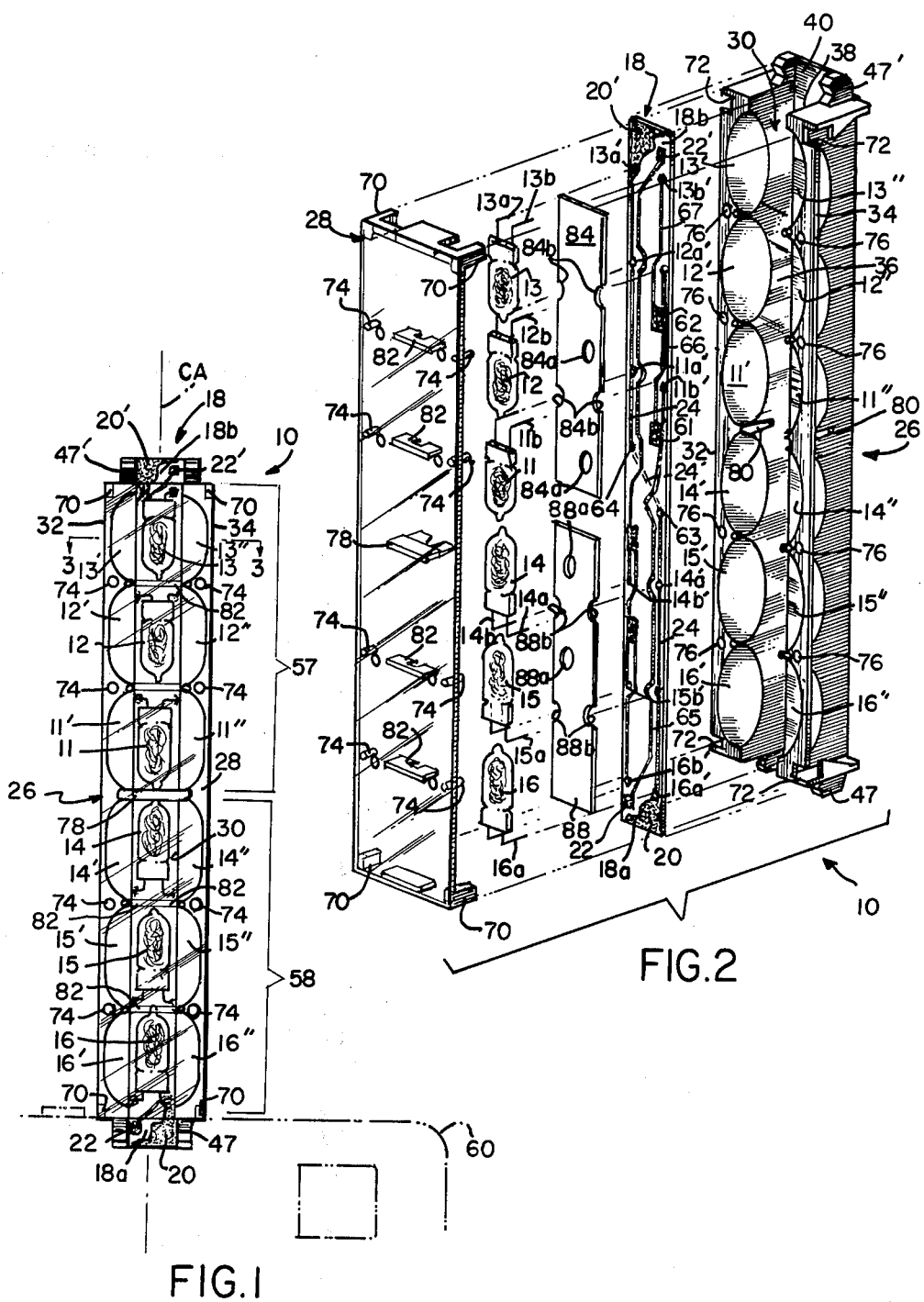
FIG. 1 is a front elevation of a multilamp photoflash unit in accordance with the invention, with the camera on which it is mounted shown in phantom.
FIG. 2 is an exploded perspective view of the photoflash unit of FIG. 1.

FIGS. 1 and 2 illustrate a multilamp photoflash unit 10 similar to that described in the aforementioned copending application Ser. No. 072,251. It comprises a linear array of six flashlamps 11–13 and 14–16 mounted on a printed circuit board 18 in the form of an elongated strip. Each of the lamps has a pair of lead-in wires 11a, 11b, etc., connected to the printed circuitry on strip 18. For example, the lead-in wires 11a, 11b, etc., may be soldered to respective connector pads 11a', 11b', etc., forming portions of the conductive circuit runs on strip 18. Each of the lamps 11, etc., has a tubular light-transmitting glass envelope having a press-seal base at one end through which the lead-in wires emerge, and an exhaust tip at the other end. The envelope is filled with a quantity of filamentary combustible material, such as shredded zironium, and a combustion-supporting gas, such as oxygen. The ignition means within the lamp envelope may comprise, in the case of a low voltage source, a filament connected across the inner ends of the lead-in wires with beads of primer material disposed about the junctions of the lead-in wires and filament. In the case of a high voltage power source, for which the illustrated embodiment is particularly intended, the ignition structure may comprise a primer bridge or a spark gap type construction. For example, a particularly suitable high voltage type flashlamp suitable for use in the linear array according to the present invention is described in U.S. Pat. No. 4,059,389, wherein the ignition structure comprises a pair of spaced apart lead-in wires with spherically shaped terminations, a glass frit coating over lead-in wires, and a coating of primer material over the frit-coated terminations. The primer may bridge the wire terminations or comprise separate spaced apart coatings on the respective terminations, with the filamentary combustible being in contact with both terminations to provide a conducting path therebetween.

When the flashlamps are mounted and positioned on circuit strip 18, the lead-in wires 11a, 11b, etc., are bent at a right angle, as illustrated, so that all of the tubular envelopes of the lamps are positioned with the longitudinal axes thereof substantially parallel to the surface of the printed circuit strip 18 and arranged in a substantially coaxial alignment along a common longitudinal axis CA. Further, as described in copending application Ser. No. 072,526, filed Sept. 4, 1979, and assigned to the present assignee, the three lamps 11–13 at the top half of the array are inverted with respect to the three lamps 14–16 at the bottom half of the array.

Referring to FIG. 2, the circuit strip 18 has a "printed circuit" thereon for causing sequential flashing of the lamps by applied firing voltage pulses. In this particular embodiment, essentially the entire printed circuit is provided on one surface of the strip 18, namely, the obverse side of the strip over which the flashlamps are positioned. The substrate of strip 18 comprises an insulating material, such as polystyrene, and the pattern of conductor runs may be provided on the surface thereof by means such as silk screening, chemical etching, etc. Each end of the circuit strip 18 functions as a connector tab, denoted as 18a and 18b respectively. The tab 18a is provided with a pair of electrical terminals 20 and 22, and similarly, the tab 18b is provided with a pair of terminals 20' and 22' for contacting terminals of a camera socket for applying firing voltage pulses to the array. The terminals 20 and 20' form part of and are connected to a common circuit conductor run 24 which is connected electrically to one lead-in wire of each of the flashlamps. As a result, terminals 20 and 20' function as part of a "ground" circuit and are shown as having an enlarged configuration for reducing the likelihood of lamps being accidentally flashed by electrostatic voltage when the array is handled.

Figure 3:
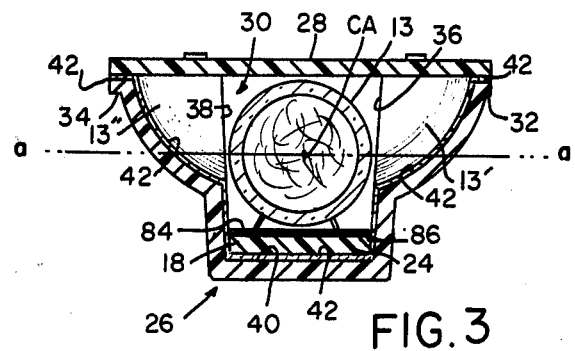
FIG. 3 is an enlarged cross-section view taken along 3—3 of FIG. 1.

The circuit strip-lamp assembly, which forms the functional core of the unit 10, is enclosed in a comparatively simple and compact housing construction of a cost-efficient and versatile design. More specifically, the unit enclosure comprises just two components, namely, a rear housing member 26 and a light-transmitting cover panel 28. Referring also to FIG. 3, housing member 26 has an elongated configuration and includes a longitudinal channel 30 which has a cross-section which is substantially semi-rectangular. The circuit strip-lamp assembly is located within channel 30, and cover panel 28 is attached to the front of the housing 26 so as to enclose the lamps. As illustrated in FIG. 1, the ends or tabs, 18a or 18b of the circuit strip extend beyond the opposite ends of the elongated cover panel 28 to expose the terminals 20, 22 and 20', 22', thereon for connection to a camera.

The rear housing member 26 further includes outer flanges 32 and 34 which adjoin the opposite sidewalls 36 and 38 respectively, of the semi-rectangular channel. Formed in these outer flanges are a plurality of symmetrical segments of parabolic reflector cavities, with each pair of reflector cavity segments 11', 11", etc., on opposite sides of the channel 30 being associated with a respective one of the flashlamps 11, etc. Housing member 26 is molded of an insulating plastic material, such as polystyrene, but reflective surfaces are provided adjacent to all the flashlamps by covering all of the surfaces of channel 30 (i.e., sidewalls 36 and 38 and rear wall 40) and the surfaces of the outer flanges 32 and 34 which face the cover panel, including the parabolic reflector cavity segments 11', 11", etc., with a continuous coating of conductive reflective material 42. For example, the channel and front surfaces of the flanges may be metalized, such as by an aluminum vacuum deposition process. In this manner, member 26 integrally functions as a compact, cost-efficient, multicavity reflector member in addition to functioning as a rear housing enclosure. There is no separate multicavity reflector element. It will be noted that the lamp-carrying terminal strip is located substantially internal to this housing-reflector member. Further, referring particularly to FIGS. 1 and 3, it will also be noted that the common longitudinal axis CA of the linear array of flashlamps 11, etc., is substantially parallel to the longitudinal axes of printed circuit strip 18 and channel 30 and lies in a plane a-a which symmetrically intersects the parabolic reflector cavity segments 11', 11", etc., on opposite sides of the channel. Hence, portions of the reflector cavities and sidewall reflective surfaces are located behind the longitudinal center line of the lamps so that as each lamp is flashed, light is projected forwardly of the array.

The housing member further includes integral extensions 47 and 47' at the opposite ends thereof which partly surround and protect the extending connector tabs 18a and 18b of the printed circuit strip 18, exposing the terminals thereon, and also function to facilitate mechanical attachment to the camera socket. The printed circuit strip 18 may be secured in channel 30 by means such as providing an interference fit with walls 36 and 38 or by applying a cement between the back of the strip 18 and the rear channel wall 40 (FIG. 3).

The light-transmitting cover panel 28 basically comprises a planar strip of clear plastic material, such as polystyrene, and may be attached to the plastic rear housing member 26 by conventional methods, such as the use of cement or ultrasonic welding about the periphery. Improved structural rigidity and cost-efficiency, however, are provided by a preferred method of attachment described in copending application Ser. No. 072,529, filed Sept. 4, 1979, and assigned to the present assignee. Referring to FIGS. 1 and 2, the cover panel molding includes four rectangular corner posts 70 which fit into corresponding slots 72 in the housing member flanges and straddle respective ends thereof. These corner posts grip the sides of housing member 26 on the outside and are ultrasonically welded thereto. This secures the ends of the panel and prevents spreading of the respective ends of the housing. Along each side of the midportion of the cover are provided four cylindrical posts 74 (a total of eight) which fit into corresponding holes 76 in the rear housing. Ultrasonically heated and pressure-formed rivet heads (not shown) are formed on the ends of these posts to secure the longitudinal edges of the cover to the housing. Further, cover panel 28 includes a transverse web 78 which projects from the center thereof and fits within slots 80 in the sidewalls 36 and 38 of the housing channel 30. Web 78 thereby bridges the housing channel to provide oppositely directed forces with respect to the four corner posts 70 so as to prevent collapse of the central portion of the cover panel and assure a snug fit. Ultrasonic welding is also employed on each side of the web 78 which engages a slot 80.

As described in copending application Ser. No. 072,534, filed Sept. 4, 1979, and assigned to the present assignee, the integral transverse web 78 of cover 28 also provides a light-attenuating partition between the tips of lamps 11 and 14 to prevent sympathetic flashing. Additional transverse webs 82 of reduced size are also provided as integral parts of cover 28 to prevent sympathetic flashing between the remainder of the lamps.

When fully assembled, the completed photoflash unit according to the invention is provided with a plug-in connector tab 18a at the lower end thereof which is adapted to fit into a camera or flash adapter. A second plug-in connector tab 18b is provided at the top end of the unit whereby the array is adapted to be attached to the camera socket in either of two orientations, i.e. with either the tab 18a or 18b plugged into the socket. The lamps are arranged in two groups of three disposed on the upper and lower halves, respectively, of the elongated linear array. Upper group 57 comprises lamps 11-13, and lower group 58 includes lamps 14-16; the reflector cavity segments 11', 11", etc., along with the reflective channel sidewalls, are associated with the respective lamps so that as each lamp is flashed, light is projected forwardly of the array. The lamps are arranged and connected so that when the array is connected to a camera by the connector tab 18a (such as illustrated in FIG. 1 for the case of camera 60 shown in phantom) only the upper group 57 of the lamps will be flashed, and when the array is turned end for end and connected to the camera by the other connector tab 18b, only the then upper group 58 of lamps will be flashed. By this arrangement, only lamps relatively far from the camera lens axis are flashable, thus reducing the undesirable red-eye effect.

Referring to FIG. 2, the circuit board 18 has a "printed circuit" thereon for causing sequential flashing of the lamps by firing voltage pulses applied to the terminals 20, 22, 20', 22'. The top and bottom of the printed circuitry preferably are reverse mirror images of each other. The circuit located on the upper half of the circuit strip 18 and activated by the pair of terminals 20 and 22 includes three lamps 11-13 arranged in parallel across the input terminals. The circuit also includes two normally open (N/O) radiant-energy-activated connect switches 61 and 62 for providing sequential flashing of lamps 11-13 in response to firing pulses successively applied to the input terminals 20 and 22. Each N/O connect switch is responsive to the flashing of an associated lamp to form a closed circuit condition. One terminal (lead-in wire) of each of the lamps 11-13 is connected in common by means of an electrical "ground" circuit run 24 to input terminal 20. The "ground" circuit run 24 includes the terminals 20 and 20' and makes contact with one of the lead-in wires for each of the lamps 11-16. This "ground" circuit crossover is accomplished at the midportion of the circuit strip, without interferring with the "hot", or signal, conductor runs by terminating the common conductor runs 24 on each half of the strip at through-connection points 63 and 64, such as eyelets passing through the strip 18, and interconnecting these points on the reverse side of the strip by a common conductor segment, indicated as 24'.

The first lamp to be fired, namely, lamp 11, is connected directly across the input terminals 20 and 22. The N/O connect switches 61 and 62 are series connected in that order with lamp 13, which is the third and last lamp to be fired, across the input terminals 20 and 22. The second lamp to be fired (lamp 12) is series connected with the N/O switch 61.

Terminal 22 is part of a "hot" or signal circuit conductor run 65 that terminates at a lead-in wire of lamp 11 and one terminal of the N/O switch 61. The other side of switch 61 is connected to a lead-in wire of lamp 12 and to one terminal of N/O switch 62 via circuit run 66. Circuit run 67 then connects the other terminal or switch 62 to a lead-in wire of lamp 13.

The radiant-energy-activated N/O connect switches 61 and 62 are in contact with and bridge across the circuit runs that are connected to them. The material for the connect switch is selected to be of the type initially having an open circuit or high resistance, the resistance thereof becoming literally zero or a lower value when the material receives radiation in the form of heat and/or light from a respective adjacent lamp, upon the lamp being flashed. For this purpose, each of the connect switches is respectively positioned behind and near to an associated flashlamp. More specifically, switch 61 is positioned behind lamp 11, and switch 62 is positioned behind lamp 12.

The high resistance paste used to make switches 61 and 62 may comprise a known mixture of silver compound and a binder. According to a preferred embodiment, however, the material comprises a silver compound such as silver carbonate, a binder such as polystyrene resin, a large proportion of electrically non-conductive inert particulate solids, such as titanium dioxide, and a protective oxidizing agent such as barium chromate. For example, as described in a copending application Ser. No. 021,398, filed Mar. 19, 1979, and assigned to the present assignee, the dried composition of a specific silk screenable high resistance material comprises 67.43% silver carbonate, 22.48% titanium dioxide, 8.99% glass beads, 0.11% barium chromate, 0.07% lecithin as a wetting agent, and 0.91% polystyrene resin as a binder. The barium chromate was included to enhance environmental stability, as described in U.S. Pat. No. 4,087,233. This mixture is made into a paste by ball milling in a suitable solvent such as butyl cellosolve acetate. The solids content may be adjusted to suit the method of switch application. For silk screening over a circuit strip, it is preferred to adjust the solids content to about 74%.

Figure 4:
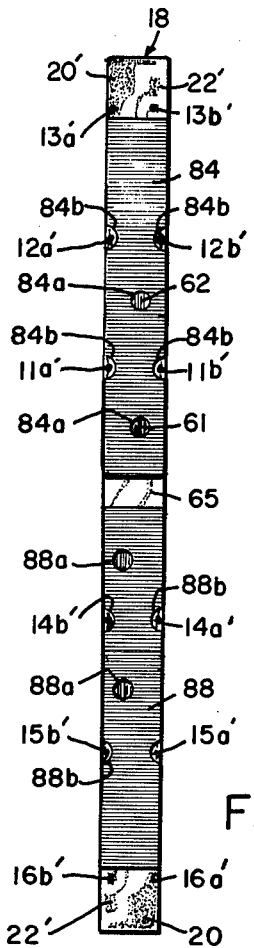
FIG. 4 is a front elevation of the circuit board employed in the unit of FIG. 1 with the flat sheet of reflective-insulating material secured thereto.

In accordance with the present invention, referring to FIGS. 2-4, the circuitry at the top half of the circuit strip 18 is thermally protected by a flat sheet 84 of a material which is thermally insulating and capable of reflecting both heat and light. More specifically, the flat sheet 84, which preferably may comprise a sheet of white paper, is interposed between the lamps 11-13 and the circuit-carrying side of circuit strip 18 and secured to the circuit board surface, such as by means of an adhesive coating 86 (FIG. 3) on the side of the flat sheet 84 facing the printed circuit board. To facilitate transfer of radiant energy for activating the switches, the insulating sheet 84 contains a pair of apertures 84a which are respectively aligned with the central portions of the printed switches 61 and 62. In addition, the sheet 84 has openings therein at the locations 11a', 11b', etc., where the lamp lead-in wires are connected to the circuitry. More specifically, semi-circular cut-outs 84b are provided for the connector pads 11a', 11b' and 12a', 12b', and the top end of the sheet 84 terminates prior to covering connector pads 13a', 13b'.

The lower half of the circuit strip 18 is protected in a like manner by means of an adhesively coated white sheet of paper 88 having apertures 88a and edge cut-outs 88b.

Testing of various materials indicated that an inexpensive adhesive-coated, white, paper label stock, when used as the sheets 84 and 88, not only protected the conductive circuit runs and switches 61 and 62 from thermal damage, but also contributed a significant gain of more than 10% in light output. Hence, the sheets 84 and 88 function to reflect heat and light away from the circuit strip 18 and insulate at least portions of the circuitry from the radiant output of the lamps during flashing. The size of the apertures 84a and 88a can be selected by means of empirical testing to control the desired amount of switch material exposed to the heat from the flashlamp. Use of an adhesive-coated paper to reinforce the plastic circuit strip provides the additional advantage of improving the rigidity of the circuit strip for better process handling. The paper insert becomes integral with the circuit strip component and thereby remains fixed in position for more reliable switch operation.

The circuit on the circuit strip 18 functions as follows. Assuming that none of the three lamps on the upper half of the unit have been flashed, upon occurrence of the first firing pulse applied across the terminals 20 and 22, this pulse will be directly applied to the lead-in wires of the first-connected flashlamp 11, whereupon lamp 11 flashes and becomes an open circuit between its lead-in wires. Heat and/or light radiation from the flashing first lamp 11, via the lower aperture 84a, is operative to activate the N/O connect switch 61. As a result, the radiation causes the normally open connect switch 61 to become a closed circuit (or a low value of resistance), thereby connecting the circuit strip terminal 22 electrically to the second lamp 12 via circuit run 66. By the time this occurs, the firing pulse has diminished to a value insufficient to cause the second lamp 12 to flash. When the next firing pulse occurs, it is applied to the lead-in wires of the second lamp 12 via the now closed connect switch 61, whereupon the second lamp 12 flashes and becomes an open circuit between its lead-in wires, with the lamp radiation, via upper aperture 84a, causing the connect switch 62 to assume a near zero or low resistance. When the next firing pulse occurs, it is applied via the now closed connect switches 61 and 62 to the lead-in wires of the third flashlamp 13, thereupon causing the lamp to flash. Since this lamp is the last lamp in the active circuit, it does not matter whether its lead-in wires are an open or closed circuit after flashing. When the flash unit is turned around and the other connector tab 18b attached to the camera socket, the group 58 of lamps that then becomes uppermost and farthest away from the camera lens will be in the active circuit and will be flashed in the same manner as has been described. In a preferred embodiment, the lamps 11, etc., are high voltage types requiring about 2,000 volts, for example, at low current for flashing, and they can be fired by impacting or stressing a piezoelectric element in the camera.

Although the invention has been described with respect to specific embodiments, it will be appreciated that modifications and changes may be made by those skilled in the art without departing from the true spirit and scope of the invention. For example, the construction is not limited to linear high voltage arrays. The array may be single ended, with a connector at only one end; the lamps may all be oriented in one direction; and the number of lamps may vary. For example, a higher output lamp array of the double ended type may comprise two lamps of much larger volume positioned in each of the upper and lower groups housed in a package of slightly larger dimensions. The insulator sheets 84, 88 may be attached by other means, such as heat sealing or mechanical holding, and may comprise other materials, such as plastic films.

We claim:

1. A multilamp photoflash unit comprising, in combination, a printed circuit board having lamp-firing circuitry on a surface thereof, an array of electrically ignitable flashlamps positioned over said surface and having lead-in wires connected to said circuitry, and a flat sheet of material secured to said circuit board and interposed between said lamps and said circuitry for reflecting heat and light away from said circuit board and insulating at least portions of said circuitry from the radiant output of said lamps during flashing.

2. The photoflash unit of claim 1 wherein said flat sheet of material is white paper.

3. The photoflash unit of claim 2 wherein said sheet of white paper is adhesively coated on one side and secured thereby to said surface of the circuit board.

4. The photoflash unit of claim 1 wherein said circuit board is in the form of an elongated strip, said flashlamps are disposed in a linear array over said surface, and said unit further includes an elongated housing member having a longitudinal channel within which said printed circuit board is located, said channel having a cross-section which is substantially semi-rectangular, said circuit board being parallel to the rear wall of said channel with said rear wall facing the side of said circuit board opposite that over which the lamps are positioned, the opposite sidewalls of said channel having reflective surfaces adjacent said flashlamps, and a light-transmitting cover panel attached to said housing member and enclosing said flashlamps therein.

5. The photoflash unit of claim 1 wherein said circuitry includes a plurality of radiant-energy-activated switches disposed on said circuit board in alignment with respective lamps, each of said switches comprising a mass of high resistance material convertible to a conductive state upon being activated by radiant energy, and said flat sheet of material has a plurality of apertures therein respectively aligned with the central portions of said switches.

6. The photoflash unit of claim 5 wherein said flat sheet of material has openings therein at the locations where said lead-in wires are connected to said circuitry.

7. The photoflash lamp of claim 6 wherein said flat sheet of material is white paper and is adhesively coated on one side and secured thereby to said surface of the circuit board.

8. The photoflash lamp of claim 7 wherein said circuit board is in the form of an elongated strip, said flashlamps are disposed in a linear array over said surface, and said unit further includes an elongated housing member having a longitudinal channel within which said printed circuit board is located, said channel having a cross-section which is substantially semi-rectangular, said circuit board being parallel to the rear wall of said channel with said rear wall facing the side of said circuit board opposite that over which the lamps are positioned, the opposite sidewalls of said channel having reflective surfaces adjacent said flashlamps, and a light-transmitting cover panel attached to said housing member and enclosing said flashlamps therein.

* * * * *